United States Patent [19]

Lemelson

[11] Patent Number: 4,831,230
[45] Date of Patent: May 16, 1989

[54] SURFACE SHAPING AND FINISHING APPARATUS AND METHOD

[76] Inventor: Jerome H. Lemelson, 85 Rector St., Metuchen, N.J. 08840

[21] Appl. No.: 936,484

[22] Filed: Nov. 26, 1986

Related U.S. Application Data

[63] Continuation of Ser. No. 647,897, Sep. 6, 1984, abandoned, which is a continuation of Ser. No. 571,188, Apr. 24, 1975, abandoned, which is a continuation of Ser. No. 163,203, Jul. 16, 1971, abandoned, which is a continuation of Ser. No. 849,013, Aug. 11, 1969, abandoned, which is a continuation-in-part of Ser. No. 422,875, Nov. 25, 1964, Pat. No. 3,461,347, and a continuation-in-part of Ser. No. 710,517, Mar. 5, 1968, and a continuation-in-part of Ser. No. 501,395, Oct. 22, 1965, Pat. No. 3,371,404, and a continuation-in-part of Ser. No. 421,897, Dec. 29, 1964, Pat. No. 3,504,063.

[51] Int. Cl.$^4$ .................. B23K 15/00; H01J 37/06
[52] U.S. Cl. .................. 219/121.12; 219/121.14; 219/121.19; 219/121.2; 219/121.31
[58] Field of Search ............. 313/339, 348, 455; 219/121 EB, 121 EM, 121 L, 121 LM, 121 R, 121 EE, 121 EF, 121 EG:121 EJ, 121 EK, 121 EX, 121 EU, 121.12–121.35

[56] References Cited

U.S. PATENT DOCUMENTS

| | | | |
|---|---|---|---|
| 2,746,420 | 5/1956 | Steigerwald | 219/121 EE |
| 3,165,619 | 1/1965 | Cohen | 219/121 EC |
| 3,303,319 | 2/1967 | Steigerwald | 219/121 EG |
| 3,330,696 | 7/1967 | Ullery | 219/121 LM |
| 3,360,398 | 12/1967 | Garibotti | 219/121 EB |
| 3,562,141 | 2/1971 | Morley | 219/121 EE |

*Primary Examiner*—Teresa J. Walberg
*Attorney, Agent, or Firm*—Neil F. Markva

[57] ABSTRACT

An apparatus and method for shaping and surface finishing articles and material of manufacture by means of intense radiation. In one form intense radiation, such as generated by an electron beam or beam of coherent light energy generated by a laser is controlled and caused to scan a portion of the surface of an article in such a manner as to selectively erode or vaporize material from the surface stratum of the article to shape or finish the surface thereof. In another form, the beam energy is employed to melt a portion of the surface stratum in a scanning operation wherein the melted material cools and solidifies into a layer having improved physical characteristics. In a modified form, such melted material is caused to flow and vary the shape of the article.

39 Claims, 2 Drawing Sheets

SURFACE SHAPING AND FINISHING APPARATUS AND METHOD

RELATED APPLICATIONS

This is a continuation of application Ser. No. 647,897, filed Sept. 6, 1984, now abandoned, which is a continuation of copending application Ser. No. 571,188 filed Apr. 24, 1975 (now abandoned) as a continuation of Ser. No. 163,203 filed July 16, 1971 (now abandoned) which was a continuation of Ser. No. 849,013 filed Aug. 11, 1969, abandoned, as a continuation-in-part of Ser. No. 422,875 filed Nov. 25, 1964, now U.S. Pat. No. 3,461,347 and Ser. No. 710,517 filed Mar. 5, 1968; Ser. No. 501,395 filed Oct. 22, 1965 now U.S. Pat. No. 3,371,404 and Ser. No. 421,897 filed Dec. 29, 1964 now U.S. Pat. No. 3,504,063.

In a preferred form of the invention, a master controller, such as an electronic computer, is employed to control the operation of a radiation beam generator, such as an electron gun or a laser and to also control power operated means for feeding one or more solid, liquid, particulate, gaseous, vaporous or plasma materials into a beam of directed radiation or adjacent to the area of the surface of the workpiece which is intersected by such beam so as to permit computer controlled or preprogrammed operations to be performed with respect to a selected portion or portions of a workpiece, such as the selective deposition of one or more materials onto such select portion of the workpiece for the purpose of coating and protecting the select portion of the work or providing an alloying or hardening surface stratum thereon.

SUMMARY OF THE INVENTION

This invention relates to an apparatus and method for predeterminately operating on matter by means of an intense radiation beam, such as an electron beam formed by an electron gun. Heretofore, it has been known in the art to employ an intense electron beam to melt matter such as metal in the form of a rod by generating such beam at sufficient intensity to rapidly heat matter which is intersected by the beam to a degree that the beam will render the matter molten for the purpose of refining metal, boring a hole through sheet material or welding two or more members together by the localized melting of material.

The instant invention is primarily directed to an apparatus and method employing high intensity radiation such as generated by an electron gun or laser, for shaping a substrate, particularly the surface stratum thereof for the purposes of surface finishing same, eliminating surface deflects such as surface cracks cavities and other irregularities and forming composite articles of manufacture such as solid state electrical circuits on a flat surfaced substrate. The apparatus provided herein may also be employed for selectively depositing and bonding one or more materials to select portions of the surface of a substrate or components formed of or secured to the surface of such substrate, such as electrical circuit components by processes including beam doping and deposition techniques as disclosed in my parent application Ser. No. 422,875 filed Nov. 25, 1964, now U.S. Pat. No. 3,461,347.

Accordingly it is a primary object of this invention to provide a new and improved apparatus and method for surface finishing and forming the surfaces of articles of manufacture employing radiation such as radiation beams generated by lasers or electron guns.

Another object is to provide an apparatus and method for correcting or reducing surface defects, flaws and cracks in articles of manufacture.

Another object is to provide an apparatus and method for forming electrical circuits such as microminiature electronic switching circuits and the like by controlled beam radiation used to deposit and/or erode material from the surface of a substrate or an electrical component secured to a substrate.

Another object is to provide an apparatus and method for vaporizing material from the surface of a substrate by heat transferred from an intense radiant energy beam and a fuel or oxidizing material fed to the surface of the substrate.

Another object is to provide an apparatus and method for shaping the surface of an article by rendering a portion of the surface stratum molten or liquid and causing the flow of such molten material from the area where it is rendered molten.

Another object is to provide a radiation beam apparatus which may not only be operated to selectively erode select portions of a substrate but may also be employed to selectively and predeterminately deposit material onto selected areas of the substrate.

Another object is to provide an apparatus and method for forming contoured surfaces of both convex and concave shape without the need to machine same by conventional techniques.

Another object is to provide improvements in an apparatus for selectively depositing material onto a substrate by means of an intense radiation beam.

Another object is to provide a new and improved electron beam apparatus which is computer controlled.

With the above and such other objects in view as may hereinafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

Figure 1:
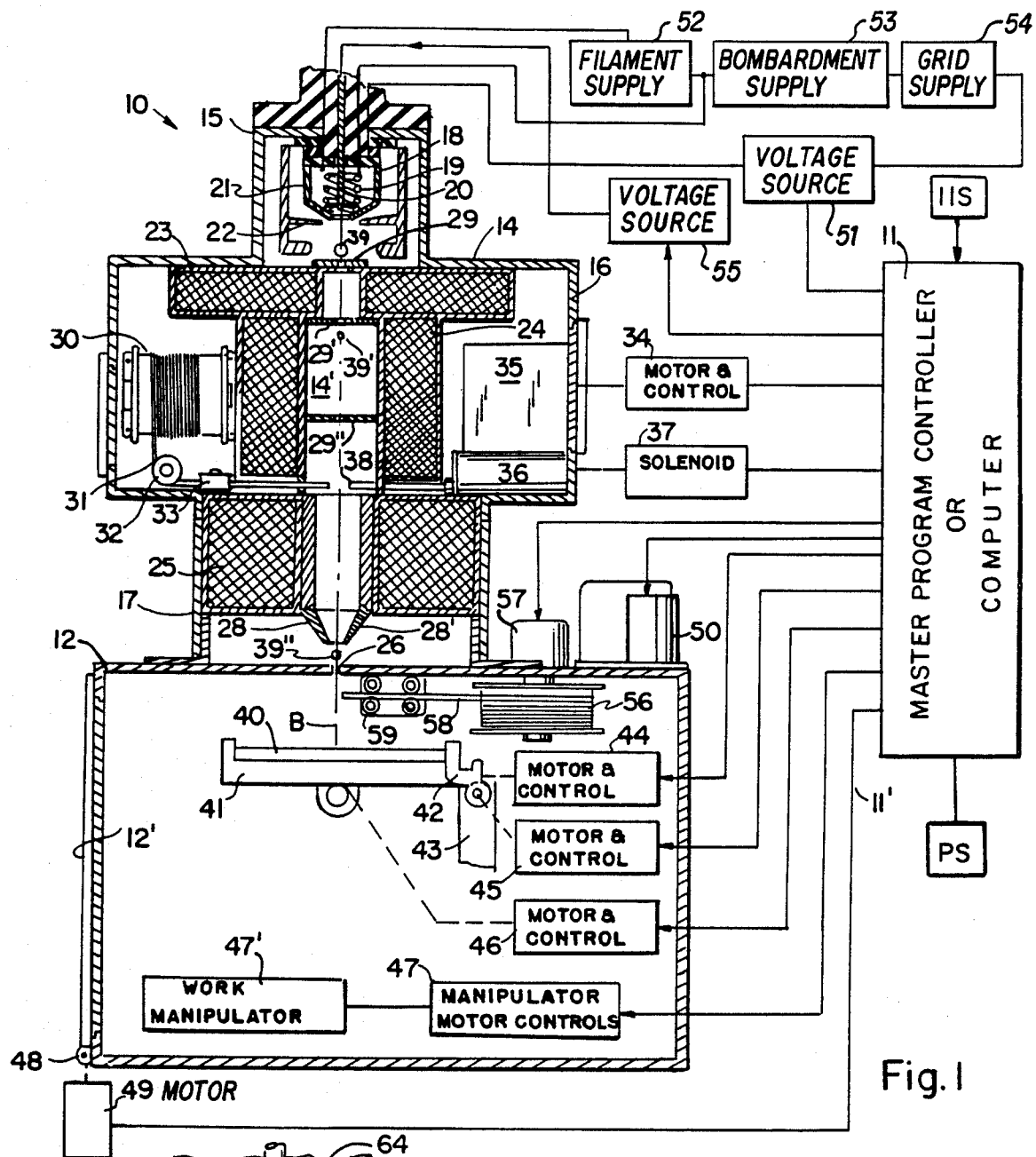
FIG. 1 is a side view with parts broken away for clarity of an electron beam apparatus which may be operated to predeterminately deposit material onto a substrate as well as to erode said substrate.

Referring now to the drawings, FIG. 1 illustrates an electron beam apparatus 10 which may be operated to perform a plurality of different functions including the selective deposition of one or more materials onto a substrate to perform functions, such as electronic circuit fabrication functions employing the selective depositing of select materials onto a substrate or circuit element, as set forth in parent application Ser. No. 422,875 filed Nov. 25, 1964, now U.S. Pat. No. 3,461,347 and/or the selective erosion or machining of said substrate. The apparatus 10 is composed of a chamber 12 containing work to be processed by an electron beam B which is generated within and directed through a chamber 14 disposed on top of the chamber 12 communicating with said chamber 12 by means of a small opening 26 in the upper wall of chamber 12. Disposed at the upper end of chamber 14 in a housing 15 is an electron beam generating assembly 18 which includes a filament 19 surrounding a rod-like cathode 20. The rod-shaped emitter 20 is indirectly heated by the filament 19 and generates an electron beam when a suitable source of high voltage 55 is connected to the emitter 19. Surrounding the described elements is a heat shield 21 and disposed directly beneath and adjacent the heat shield is a grid 22. Suitable filament supply, bombardment supply and grid supply means denoted 52, 53 and 54 are provided and connected to the respective elements of the emission assembly 18 for generating a suitable electron beam which is directed through a small opening in an anode plate 29, thence into an elongated passageway 14' which is shown surrounded by electro-magnetic coils denoted 23, 24 and 25, the purpose of which will be described. Plates 29, 29' and 29" contain collimating slits for the beam B.

At the end of passageway 14', the beam passes a pair of focusing pole pieces 28 and 28' which serve to focus the beam through an opening 26 in the upper wall of chamber 12 against a selected area of a work piece 40 disposed in alignment with said opening.

The hereinabove described electron beam apparatus may be modified or supplemented with features found in known electron gun apparatus such as provided, for example, in U.S. Pats. Nos. 2,944,172 and 3,009,050 and in the texts "The Focusing of Charged Particles" edited by Albert Septier.

The work piece 40 is shown as a flat substrate such as a sheet or plate of metal or insulating material such as ceramic or plastic and may comprise an electronic circuit board or other device on which it is desired to perform operations of selectively adding material thereto and/or eroding or removing material therefrom. The substrate 40 is shown secured to a fixture or table 41 which is operative to move at least in two directions by predeterminately controlling respective motors 44 and 46 so as to locate any particular area of the substrate 40 in direct alignment with the opening 26 and the beam passed therethrough to permit preprogrammed operations of said beam on said substrate. A solenoid or motor 45, when controllably operated, actuates a clamp 42 which operates to secure the work piece 40 on the fixture 41 or release same so that it may be removed from said fixture. The support 41 is movably mounted with respect to a base 43 and is prefereably positionally controlled by respective lead screws driven by the motors 44 and 46 in accordance with the manner of conventionally positioning a work table with respect to a machine tool. Notation 47 refers to one or more motors and controls therefore for operating an automatic manipulator 47' located either within or exterior of the chamber 12 and operative to remove individual units of work from the table 41 and to replace same with new work to be processed in synchronization with the operation of the motor 45 operating the clamp 42. A door 12' is opened and closed by means of a motor 49 operating a suitable cam mechanism 48 at the door hinge to permit work to be inserted into and removed from chamber 12.

While the described electron beam generating means does not ordinarily require vacuum to generate and direct the electron beam against the work, a vacuum pump 50 is illustrated in FIG. 1 and is operatively connected to chamber 12 in the event that certain types of operations require that the work, during bombardment by the beam, be provided in a vacuum.

A master controller 11, such as an adjustable multicircuit, self-recycling timer or other form of program controller or computer, is provided having a plurality of outputs 11' on which are generated respective command control signals for controlling all of the described motors and other servos as well as those which will be described hereafter, so that the apparatus 10 may be operated in a preprogramed manner which includes the replacement of work previously processed with new work suitably aligned on the fixture or table 41, the predetermined location and subsequent movement of said table 41 to bring different areas thereof in alignment with the beam, the programmed operation of the beam and, as will be described hereafter, the programmed admission of one or more materials to the electron beam to permit their selective deposition onto selected areas of the surface of work piece 40 for the construction of electrical circuits, the selective contouring of plates, or the selective coating of articles.

Materials to be deposited onto the surface of the substrate 40 may be admitted to the immediate vicinity of chamber 12 or at a plurality of points along the path of travel of the electron beam. Said material may be in the form of a solid rod or wire which is directed into the electron beam and melted or vaporized thereby and carried along or within said beam to the area of the surface of the substrate intersected by said beam so as to be deposited thereon or diffused onto the outer stratum of said substrate. The manner in which the material is deposited or diffused will be a function of the intensity of the beam which may be a constant potential or variable in accordance with command control signals generated by the master controller 11. Accordingly, notation 55 refers to a source of high potential energy connected to the rod cathode. In certain instances, it may be desirable to provide an electronic or motor operated means within the unit 55 for varying the potential output thereof in accordance with a variable command control signal generated on the input thereto by the master controller 11. Suitable means for varying the voltages applied to the filament and grid located in blocks 52 and 54 may also be provided which are varied in accordance with signals generated by the master controller 11. Accordingly, by such means, the potential and characteristics of the beam as it passes through the opening in anode 29 in the chamber 14', may be predeterminately varied in accordance with the operation to be performed thereby.

Notations 39, 39' and 39" refer to respective conduits in the form of small diameter tubes extending into the chambers 15, 16 and 17 which respectively surround the beam emitter, the elongated passageway 14' and the focusing pole pieces 28 and 28'. Respective solenoid operated valves or pumps controlled by signals generated by master controller 11 may be utilized to admit predetermined quantities of selected gases, vapors, liquids and/or powdered materials through the conduits 39, 39' and 39" to be ejected from the open ends thereof into the electron beam and to be carried along the beam through the opening 26 against the surface of the work piece 40 intersected by the beam B.

The potential and movement of electrons or particles within the beam B may be sufficient to carry particles or droplets of material admitted to the beam along the beam to the surface of the work piece. However, auxiliary means are also provided in FIG. 1 to confine the material admitted to the beam to the vicinity of the beam and, in certain instances, to induce its movement along the beam toward the work. Such means includes a plurality of electro-magnetic coils 23, 24 and 25 disposed along the passageway 14' which coils are energized in a manner to magnetically confine the particles to the vicinity of the beam and, in certain instances, to induce movement of the particles along the beam towards the work. The coil 25 may also serve to assist in focusing the beam through the focusing pole pieces 28, 28' so as to be focused at a fine point when it intersects a surface of the work.

Shown disposed within the intermediate chamber 16 is a coil 30 containing a wire 31 of material to be deposited, such as metal, which wire is guided about a plurality of rollers 32 and a pair of rollers 33 through a passageway between the coils 24 and 25 into chamber 14'. The rollers 33 are power operated by a motor (not shown) which is controlled by a motor controller 34 operated by a signal generated by the master controller 11. Thus, by properly programming master controller 11 to generate a signal which is passed to controller 34, the rate of travel of wire 31, as well as the timing of its admission to the beam B, may be predeterminately controlled so that predetermined quantities of the material of said wire may be vaporized and directed along the beam to be deposited onto the surface of the work piece in accordance with the predetermined operation of the beam and positioning of the work piece so that material may be predeterminately deposited onto selected areas of the work piece.

Notation 35 refers to a reservoir of particulate material located within the intermediate chamber 16 which is fed by means of a conveyor or motorized pump 36 through a tube 38 extending therefrom. A controller 37 receiving command control signals from the master controller 11 is connected to the motor operating the pump or conveyor 36 so that predetermined quantities of said particulate material may be fed or directed on a gas stream into chamber 14' and the beam generated therein.

A second coil 56 of metal or other suitable material provided as a wire 58 is located within chamber 12 and is rotationally mounted off the upper wall thereof and driven by a motor 57 controlled by a signal generated by the master controller 11. The wire 58 is fed between powered rolls of a guide 59 which is driven by a motor (not shown) which is also controlled by a signal or signals generated by the master controller 11. The operation of the motor operating the vacuum pump 50 may also be controlled by the master controller 11 so as to predetermine a complete cycle of operation utilizing said vacuum pump.

It is noted that wire, particulate material, liquid or gaseous streams of matter may also be directed into the electron beam B at any of the locations where tubes 39, 39' and 39" enter the chambers 15 and 16.

The wires 31 and 58 may comprise various polymers, semiconductors or ceramics, metals or alloys. Where said wires or rods are made of conducting material such as metal, they are preferably electrically insulated from the housing and are not grounded in a manner which would ordinarily cause the beam B to discharge to ground. Similarly, all tubes 39, 39', 39", 38, etc. feeding fluent material to the beam are also prefereably either made of electrical insulating material or are insulated from ground.

It is noted that the apparatus of FIG. 1 may be subject to a number of design variations and may include, for example, the provision of an endless conveyor for continuously or intermittently feeding work to be processed by the beam past the opening 26. The apparatus 10 may also be modified to permit movement of the beam housing 14 in one or more directions with respect to a large work piece and to control the location thereof with respect to selected work pieces for performing beam erosion and/or deposition operations as described. Operation of the means for energizing the electromagnetic coils 23, 24, and 25 for generating suitable magnetic fields in the vicinity of the beam to control its direction, focusing and to confine or control the flow of material admitted thereto, as described, may also be under the control of the master controller 11.

Further modifications to the apparatus of FIG. 1 include the provision of additional electrode means for generating a plurality of beams and directing same against one or a plurality of different areas of a work piece to simultaneously perform operations of the type described. For example, one beam may be operated to erode a selected area of a work piece while a second beam may be operated to selectively deposit material on another area of a work piece to both excavate and/or build up material on said work piece or to fill in areas which have been previously eroded. By simultaneously operating a plurality of beams to simultaneously deposit and/or erode material from the work piece surface, the time required to fabricate devices such as electronic circuits may be substantially reduced.

By providing means in chamber 12 for disposing lead wires against selected portions of a substrate such as an electrical circuit, one or more beams may be used to weld said wires to the substrate by melting a metal of the wire and/or depositing a weld material against the wire and substrate by means as described.

Thin or thick metal films may be deposited onto a substrate by admitting metal to the beam by one or more of the means described, as the substrate and/or beam means are moved or deflection controlled so as to form electrical circuit lines or leads on the substrate. Semiconducting, polyconducting or insulating materials may be selectively deposited on a substrate to form various electrical circuit components providing, for example, integrated circuits and the like.

Figures 2, 3, 4:
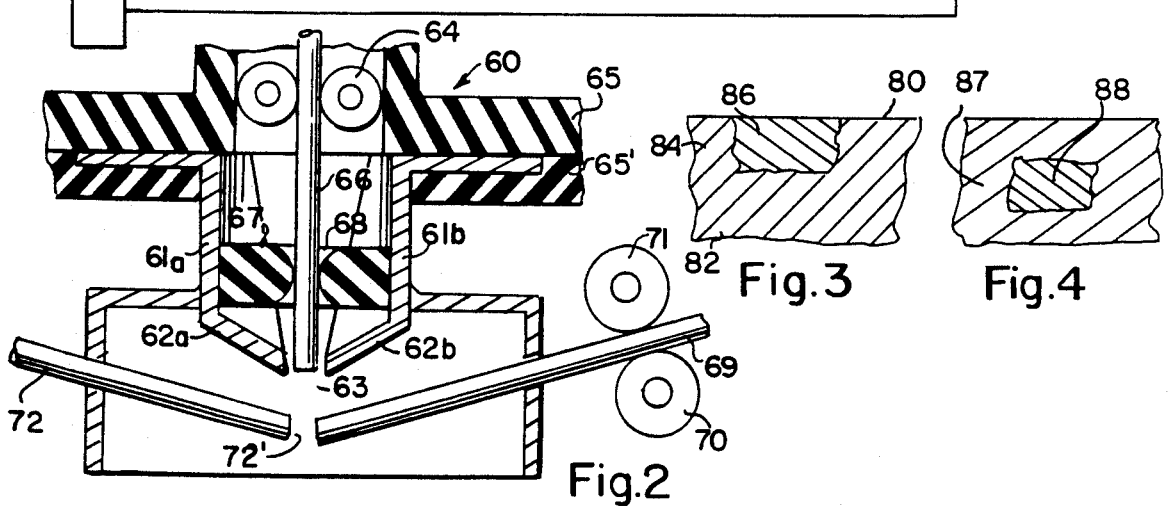
FIG. 2 is a side view of a modified form of electrode applicable to apparatus such as that illustrated in FIG. 1.
FIG. 3 is a side view in cross section of a structure produced by means of an apparatus of the type shown in FIG. 1.
FIG. 4 is a modified form of the structure shown in FIG. 3.

In FIG. 2 is shown a modified form of electron emitter and beam forming apparatus applicable to the apparatus of FIG. 1. The beam emitter assembly 60 is composed of opposed electrode portions 61a and 62b terminating at the end of the electrode and opening 63 therebetween through which material to be vaporized and carried by the beam may be fed. The electrodes may be made of suitable high temperature conducting material such as tungsten or other high temperature metal and are supported by insulating gasket plates 65 and 65'.

A first material 66 in the form of a rod or tube extends through the center of the electrodes 61a and 61b and is downwardly fed by means of a pair of powered rollers 64 operated by motor (not shown) which is preferably predeterminately controlled to control the feed, speed and timing of the drive of consumable member 66 in accordance with the operation of the computer or master controller as described. A guide 67 in the form of a plug of insulating material having an opening 68 therein receives rod 66 and guides it to the end of the conical head of the electrodes 61a and 61b. Suitable means, as described above, may be provided to heat the electrodes and the end of rod 66 a sufficient degree to cause said rod end to melt or vaporize within the beam generated by the electrodes. If the potential generated across the electrodes is of a sufficient intensity, the material melted or vaporized from the end of rod 66 will be carried along the beam towards the work as described.

The consumable electrode 66 may also comprise a hollow tube containing gaseous, liquid, vaporous or powdered material fed to the open end thereof to be dispensed into the zone in which the beam is generated.

Also illustrated in FIG. 2 is a rod 69 fed between powered rollers 70 and 71 to beneath the end of the conical electrodes 61a and 61b so as to be admitted to the vicinity thereof in which the intense beam is generated for melting or vaporizing the material of said rod.

A tube 72 is also shown in FIG. 2 which is connected to a source of fluent material such as described and having its open end 72' disposed immediately beneath the electrodes 61a and 61b so as to admit fluent material to the beam so generated for the purposes described.

While a source of electrical energy PS is shown in FIG. 1 as being operatively connected for operation of the master program controller or computer 11 which power supply may generate the electrical energy necessary to activate the controls or operate the various motors and servos of the apparatus 10, it is assumed that suitable power supplies are provided to operate all the described components such as the magnetic coils, the high voltage power supply 55, the filament supply 52, the bombardment and grid supplies 53 and 54 as well as the described material feed means and work positioning servos.

There is shown in FIG. 3 a structure in a work member which has been subjected to beam deposition operation of the type described. The work member 80 is composed of a base 82 having an upper stratum 84 composed of material deposited thereon such as semi-conducting material, metal or insulating material. Notation 86 refers to a domain of material other than that forming stratum 84 which has been beam deposited in an opening or cavity provided in 84 by the electron or intense laser beam or beams described. The material of which domain 86 is composed may comprise any suitable metal, semi-conducting materials or insulating material having characteristics which are different than those of the material defining layer 84 and may be utilized, for example, to form part of an active element of a semi-conductor device, an insulating or isolating element or domain adjacent to or surrounding an active element or a conducting element disposed in cooperative relationship to other materials (not shown) similarly deposited on or within the stratum 84.

In FIG. 4, a domain 88 of material is shown completely surrounded by a stratum 87 of material which has been deposited simultaneously and/or after the deposition of the material comprising domain 88.

Circuit conducting strip elements may also be similarly deposited along selected areas of a substrate or material deposited on a substrate to form various electrical devices and circuits. The substrate may comprise, in addition to various flat ceramic, glass or plastic materials, chips of silicon and other materials, crystals, filaments, wires, rods, foil and other electrical components and devices such as semi-conductors, integrated circuit assemblies and components, polyconducting layers, metal films, etc. In addition to depositing conducting and semi-conducting components as circuit elements, the means described herein may be used to deposit doping materials and isolating oxide materials, polyconducting materials, etc. on circuit members.

Figure 5:
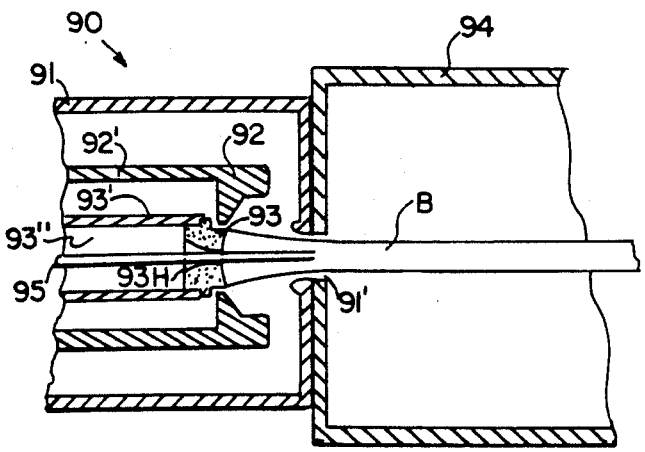
FIG. 5 is a sectioned side view of a hollow beam generating apparatus applicable to the apparatus of FIG. 1.
Figure 6:
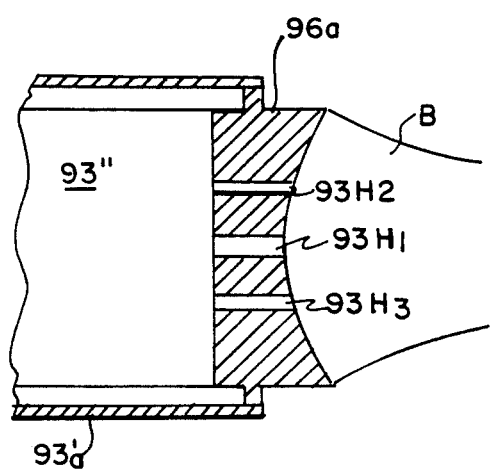
FIG. 6 is a side section view of a modified form of FIG. 5.
Figure 7:
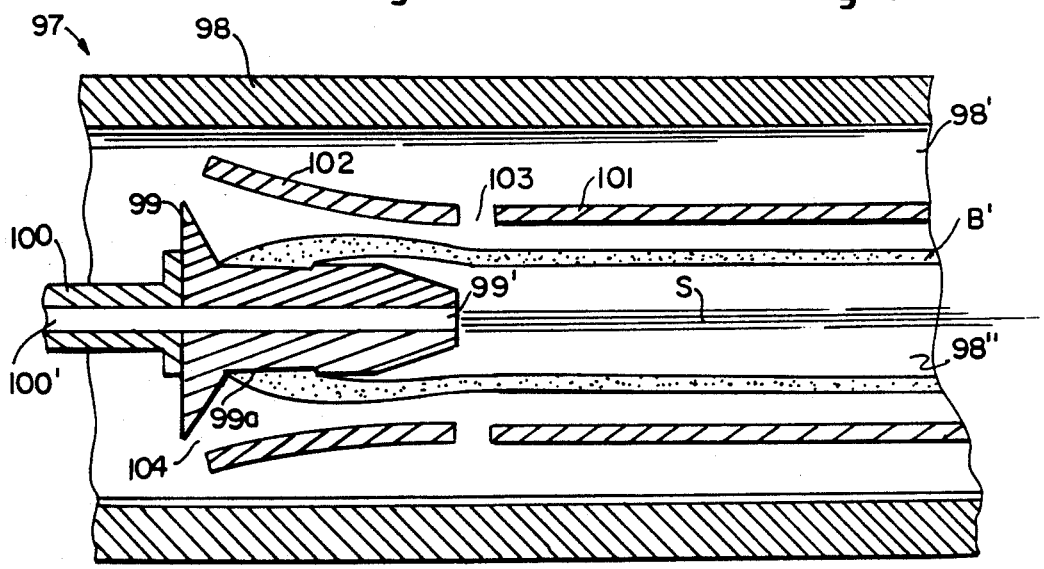
FIG. 7 is a side cross section of another form of hollow beam apparatus.

FIGS. 5 to 7 illustrate features of apparatus for forming hollow or tubular electron beams and for feeding one or more materials to the interiors of said hollow beams to be carried therewith and deposited on a substrate intersected by the beams or to cooperate with the beams in operating on the substrate. Features of the apparatus illustrated in FIGS. 5 to 7 may be applied to the apparatus of FIG. 1 or other suitable apparatus as described herein for performing various operations on solids, liquids, gases or matter in the plasma state. By "hollow or tubular electron beams" is meant electron beams which have the configuration of an elongated tube having a hollow interior or core which is not occupied by the radiation beam.

In FIG. 5, an electron beam generating apparatus 90 includes a first housing 91 in which is disposed an anode 92 attached to a mount 92'. A cathode head 93 is centrally disposed within the anode mount by means of its own mount 93' and faces an opening 91' in the housing 91 which extends through an opening in a second housing 94 which may extend to or be the equivalent of housing 16 of FIG. 1. The cathode head 93 when properly energized by a suitable source of high voltage electrical energy, is operative to generate a hollow electron beam B which converges as it passes through the opening 91' and is directed by suitable control and focusing means (not shown) out of an opening in housing 94 to the surface of a work piece such as a substrate or into a spacial volume beyond housing 94 containing gaseous or liquid matter to be reacted on by the beam. The cathode 93 contains an opening 93H therethrough, through which opening matter may be directed to the interior of the hollow beam B. Said matter may be in the form of a solid rod or wire, particulate material carried on an airstream or other fluid carrier directed through the interior volume 93" of the housing 93' and/or a gas or vapor flowed under presure into the volume 93" and directed at suitable velocity through the opening 93H to the interior of the hollow beam B. In FIG. 5, notation 95 refers to a rod which is driven by wheel drive means as described which is operated by a controlled motor, preferably under the control of a master controller of the type shown in FIG. 1. The rod 95 may be driven completely along the center of the hollow beam B to the surface of the work piece at which surface it may be melted by heat transferred directly thereto by the beam B and/or the work piece itself intersected by the beam for coating, diffusing or otherwise depositing same onto the work piece. The rod 95 may also be vaporized by the intense heat of the beam B as said rod enters the narrowest portion of the beam and the resulting vaporized metal or other material defining the rod may be carried along the interior of the beam by flow induced by the beam itself, by gas directed along the center of the rod or adjacent thereto as it passes through the opening 93H in the cathode or by moving electromagnetic fields generated by electro-magnets disposed around the housing 94 as described.

The apparatus of FIG. 5 may also be operated wherein gas under pressure is forced through the opening 93H which may be in the shape of a nozzle operative to direct said gas as a high-velocity stream along the center of the beam to the surface of the work piece. The gas may be utilized per se in cooperation with the beam to effect such operations as cutting or severing portions of the work piece intersected by the beam and gas, creating a chemical reaction in which the gas effects a change in state of the work piece, boring or drilling a hole of predetermined shape and dimension through the work piece, moving material melted by the beam or rapidly oxidizing and vaporizing or volatizing material of the work piece for the purpose of removing or machining same. The gas may also contain fine particles of solid or vaporized matter which is deposited on the work piece for any of the purposes described or may be used to erode or cause flow of the work as described or may be injected into a gaseous or liquid material for creating a chemical reaction, effecting combustion to weld or rapidly heat the volume into which the beam is injected, create a plasma such as a plasma jet or generate thrust.

In FIG. 6, a modified form of the cathode of FIG. 5 is shown having a plurality of through and through openings therein through which openings may be injected, flowed or forced the same or different liquid, gaseous or solid materials. A mount 93' a for a concave cathode 96 is disposed as part of an electron beam apparatus of the type shown in FIG. 5 and is hollow, defining a passageway 93" through which a liquid, gas or plasma may be flowed out the openings 93H1, 93H2 and 93H3. The latter two openings are shown disposed radially outwardly of the axial opening 93H1. A plurality of additional openings may also be arrayed about the center opening 93H1.

In one form of the apparatus shown in FIG. 6, a solid rod or wire may be driven through the opening 93H1 while a gas or liquid may be admitted to the center of the beam B through the openings 93H2 and 93H3 after being forced through the passageway 93" behind the cathode. Solid material directed through the openings in the cathode may be vaporized as soon as or shortly after they enter the interior of the beam B by the high-intensity electrical energy applied to the cathode 96a.

In FIG. 7, an injection gun design is illustrated for initiating a hollow beam in a uniform magnetic field. The apparatus 97 includes an elongated cylindrical magnetic coil 98 surrounding a chamber 98' in which is supported, on a tubular mount 100, a cathode 99. A passageway 100' extends through the tubular mount 100 and may be utilized for directing a solid, liquid, gaseous and/or plasma material to a passageway 99; extending through the cathode 99. The cathode 99 has a conical cathode emitting surface 99a which is surrounded by a conical shaped anode 102. The beam B' emerges from the cathode emitting surface 99a and is directed by means of a uniform axial magnetic field generated by the magnetic coil 98 so as to form a tubular beam which is passed through a drift tube 101 in the direction of the work. A gas, vapor, plasma or gas containing particles, is forced through the passageway 100' and through the axial bore 99; extending through the cathode 99. It is ejected as a stream S through the center volume 98" of the beam B' and may be flowed as the result of its velocity and/or the force induced thereby by the magnetic field or the portion of a beam particles so as to be directed through the gun against the work volume or surface intersected by the beam B'.

It is noted that auxiliary fluid, such as gas, vapor, plasma particles or solid particles may be flowed between the head end of the anode 102 and the head of the cathode 99 through the annular opening 104 or through one or more openings 103 disposed between the anode 102 and the drift tube 101 so as to be carried between the outer surface of the beam B' and the drift tube in the direction of the work to be expelled from the end of the gun towards said work with the beam B'.

While the beam B' shown in FIG. 7 is illustrated as having a relatively thin wall, the volume 98" defining the interior of the beam which does not contain beam particles may be of relatively small diameter and, in one instance, may be substantially equal to or smaller than the diameter of the bore 99' through the cathode 99 so that the gas, liquid or plasma injected through the cathode may be in contact with the beam so as to be carried thereby towards the work or so that a solid rod or wire fed through the openings 100' and 99' may be easily vaporized as it enters the hollow beam B' and the vapors thereof may be carried by the beam in the direction of the work.

In order to properly vaporize a solid rod or particles introduced into the interior volume 98" of the beam B, focusing magnetic coils may be applied downstream of the snout end of the cathode 99 to cause a pinch effect in the beam B' so as to converge the beam particles against the solid material directed into the interior of the beam for the purpose of vaporizing said material.

In a modified form of the apparatus hereinabove described, a solid rod of ion-forming material such as cesium may be directed through the annular passageway in the cathodes described or otherwise disposed along the cathode and the apparatus may be operated in such a manner as to generate ions thereof for the purpose of effecting thrust to effect propulsion of the apparatus such as rocket propulsion.

In the operation of the apparatus described, it is noted that the same beam employed to vaporize and effect deposition of material on a substrate may also be employed to erode selected portions of the substrate prior to or after material is deposited thereon. These destinct operations may be effected by program and/or adaptively controlling beam intensity, beam focus, relative movement of the beam and/or workpiece and the time the beam remains on the area being eroded so as to predetermine the depth of the cavity. Thus predeterminately contoured substrates may be formed by program controlling the above variables to erode and/or deposit material across the surface of the substrate. Electrical circuits composed of crystals or other devices having domains of different materials located at different depths therein may be so fabricated as well as prototype models or mold cavities having irregular shape.

Modified forms of the invention illustrated in FIGS. 1, 2, 5, 6 and 7 include the following embodiments:

(a) a plurality of different materials may be controllably fed simultaneously or siquentially into the intense radiation beam by predeterminately controlling the operation of respective motors or valves operative to admit said materials to the chamber and beam in a program controlled cycle determined by the operation of the master controller or computer 11 in open and/or closed loop cycles with or without the application of adaptive control thereto. Such plurality of materials may all be in the same or different states (i.e.—solid wire formations, flowed particles, liquid streams, gas or vapor streams or streams of charged particles such as plasma stream).

(b) The movement of electrons defining the beam may be utilized to induce the flow of the material in the beam to flow along the beam. In this connection, the particles of deposition material flowed to the beam or formed therein may be charged as they enter the beam or precharged prior to admission to the beam so that the combination of forces resulting from formation of the beam and its directional control means may be utilized to carry the deposition material particles along the beam towards the work. Auxiliary magnetic field coil means may be disposed along the beam to account for and direct deposition material around or within the beam towards the work. Said coils may be operative to generate static magnetic fields or moving magnetic fields which move in the direction of the beam to induce flow of the material admitted to the beam along the beam in the direction of the work.

(c) An auxiliary gas stream such as a stream of inert gas or active gas, may be directed from a conduit along the electron beam to induce flow of particles of material admitted to the beam to cause said particles to intersect the area of the work intersected by the beam or the area immediately adjacent thereto. Said gas may be introduced at one or more locations along the path of travel of the beam and controlled in accordance with the quantity and characteristics of the material admitted to the beam.

(d) The flow of the hereinabove described materials along the beam may be effected by generating a plasma at least in part by the operation of the beam and/or auxiliary electrode means surrounding the electrode which operates to generate the beam by admitting suitable material to the vicinity of said electrodes. Said plasma may be flowed as a stream surrounding the beam by suitable magnetic field generating means such as one or more electro-magnets disposed adjacent to the beam along its path of travel. Such plasma, if generated at relatively high temperature, may also be operative to cooperate with the beam in heating the surface of the work.

(e) The illustrated and above described embodiments may all utilize one or more electron beams or one or more laser light beams generated at sufficient intensity to effect the desired described results. For example, solid wire or rod, particulate, vaporous, liquid or gaseous material may be introduced into the intense light beam generated by the laser disposed in the vicinity of the electrodes illustrated and may be vaporized thereby and carried along the laser beam towards the work by one or more of the means described. Particle charging or ionizing means may be provided in the vicinity of the laser or along the beam to form a plasma-like flow of material along the beam towards the work.

(f) A plurality of electron and/or laser beams may also be generated within the chamber and each predeterminately directed to intersect a selected area or the same area of the surface of the work. One or more materials to be deposited onto the work may be introduced into each beam. One of the beams may be operative to erode preselected portions of the work substrate while one or more other beams may be operative to deposit selected amounts of material onto the substrate.

(g) The described beam or beams may be operated at sufficient intensity to not only vaporize or otherwise change the state of material admitted to the beam but also to cause the diffusion of said material into the substrate intersected by the beam after properly heating that portion of the substrate receiving the fused material. In other words, the velocity of the beam particles may be operative to cause deposition particles carried thereby to be diffused into the surface stratum of the work intersected by the beam and deposition material.

(h) Since the cathode current density increases exponentially with temperature and since relatively high temperatures may be required to vaporize certain material to be deposited, to generate plasmas or to more rapidly machine the work by generating beams of relatively high voltage (above 20 kV), the intense radiant energy beam of a laser may be employed to heat the cathode and/or the material being fed to the electron beam or the surface of the work intersected by said beam. Said laser may be conveniently located within the chamber 12 or any of the compartments of the chamber 11. The laser may also be disposed exterior of the electron gun housing with its beam directed thru an opening or window thereto such as through the passageways 39, 39' or 39''. The laser may also be supported on the shield 21, the mount for grid 22 or the insulation material supporting the cathode and may have its beam directed to intersect the cathode wire or rod 20 to supplement or replace the heating filament 19.

(i) The intense radiation beam of a laser disposed within or directing said beam through the chambers 11 and/or 12 may be utilized to cooperate with the electron beam generated by the apparatus described herein in operating on the work such as in performing operations of heating, melting, vaporizing or otherwise affecting the work. In this connection, a single laser may be employed to perform a plurality of operations in cooperation with the electron-gun apparatus such as heating the cathode and vaporizing material to be deposited, heating the cathode and the work, generating a plasma and heating the work, vaporizing material from the work while or before material is deposited by the electron beam as described or other combinations of the aforedescribed operations. A single beam may be directed to perform these multiple operations or may be split into a plurality of components and properly directed by suitable lens and/or mirror means.

(j) The described apparatus may also be utilized to perform controlled operations on liquids, vapors, gases or plasmas into which the beams and materials accompanying same are directed in a reaction chamber or free space. These operations may include controlled chemical reactions, plasma generation propulsion systems, the operation of burning devices such as furnaces and welding equipment operated at high temperature. In this latter connection, the material injected into, inside or along the beam may be oxygen, an inert gas, a material to be added for alloying, doping or adding to the material being heated or otherwise operated on by the beam.

(k) Material directed into the beam in the vicinity of the work may comprise a combustible or explosive material operative to burn above the work or generate a controlled explosion for affecting the work such as generating a chemical reaction therewith, eroding or pulverizing part or all of the work, generating a larger explosion in the vicinity of or utilizing the work, generating a controlled nuclear reaction, etc.

I claim;

1. An apparatus for selectively eroding material from the surface stratum of a substrate to predeterminate contour shape said substrate, said apparatus comprising:

(a) first means for generating radiant energy including means for forming and directing said radiant energy as a beam of collimated radiation,
(b) second means for supporting and prepositioning a substrate to be operated on by said radiant energy, a distance from said first means,
(c) third means for effecting multi-axis relative movement between said first means and said second means to permit the radiant energy beam generated by said first means to scan a portion of the surface of said substrate,
(d) fourth means for controlling said third means to effect the controlled relative movement between said substrate and a radiant energy beam generated by said first means,
(e) said first means being operable to generate and direct a narrow beam of radiation of sufficient intensity to erode material from the surface stratum of said substrate as said narrow beam scans said surface, so as to selectively remove material from the surface stratum thereof and to vary the topography of the surface of said substrate intersected by said beam, and
(f) master control means connected to control the operation of said first means and daid fourth means to predeterminately control the relative movement between a beam generated by said fist means and a substrate supported by said second means, so as to cause said beam to predeterminately scan a select portion of said substrate and to erode a predetermined amount of material from a select portion of the surface stratum of said substrate scanned by said beam in a manner to effect a predetermined variation in the shape of said substrate.

2. An apparatus in accordance with claim 1, including a chamber supporting said first, second and third means wherein said radiant energy beam is directed through said chamber to intersect the surface of said substrate disposed within said chamber, and
means for evacuating air from said chamber in a manner to permit said beam to operate on said substrate in a controlled atmosphere.

3. An apparatus in accordance with claim 2, wherein said third means comprises means for movably supporting said second means and motor means for reversably driving said supporting means for said substrate within said chamber,
said master control means being operable to control the operation of said motor means to predeterminately move said supporting means for said substrate while controlling the operation of said first means for generating radiant energy.

4. An apparatus in accordance with claim 2, including an opening to said chamber through which opening articles, to be operated on by radiant energy of said first means, may pass to be supported within said chamber by said second means,
a door for closing off said opening,
motor means for opening and closing said door,
control means for said motor means operatively connected to said master control means to be controlled thereby in a manner to permit (i) unfinished articles to be fed into said chamber and (ii) articles which have been operated on in said chamber to be removed therefrom.

5. An apparatus in accordance with claim 1, including means for generating and directing a flow of gas molecules parallel to the radiant energy beam formed by said first means as it is directed against said substrate.

6. An apparatus in accordance with claim 5, wherein said gas flow is in the form of a stream of gas and is operable to cooperate with said beam in selectively eroding material from the surface of said substrate.

7. An apparatus in accordance with claim 6, including means for introducing particles into said stream of gas.

8. An apparatus in accordance with claim 1, wherein said first means is operable to generate radiant energy at sufficient intensity to melt material of said substrate.

9. An apparatus in accordance with claim 1, wherein said first means comprises an electron gun for generating and directing a beam of electrons at said substrate.

10. An apparatus in accordance with claim 9, including
means for focusing said beam of electrons,
said focusing means being controlled by said master control means.

11. An apparatus in accordance with claim 1, wherein said first means comprises a laser for generating a beam of coherent light energy at said substrate.

12. An apparatus in accordance with claim 11, including
means for deflection controlling said beam of coherent light energy to cause said beam to selectively scan said substrate,
said deflection control means being controlled by said master control means.

13. An apparatus in accordance with claim 1, wherein said first means is operable to generate said radiant energy of sufficient intensity to cause said beam to selectively vaporize material from the surface stratum of said substrate.

14. An apparatus in accordance with claim 13, including
means for removing vaporized material from the vicinity of that portion of said workpiece from which said vaporized material is formed by said beam.

15. An apparatus in accordance with claim 1, including
means for programming said master control means to cause (i) said first means to variably generate said radiation beam and (ii) said third means to vary the relative movement between said beam and said substrate to cause said beam to scan and predeterminately erode material from a plurality of separate portions of said substrate.

16. An apparatus in accordance with claim 1, including
means for controllably depositing material onto said substrate,
said depositing means being controlled by said master control means to permit said substrate to be both predeterminately eroded of a selected amount of its material and to be predeterminately built-up with deposited material so as to permit the controllable shaping of said substrate and the formation of a predetermined composite structure thereof.

17. An apparatus for fabricating electrical circuits, said apparatus comprising in combination:
(a) first means for generating radiant energy including means for forming and directing said radiant energy as a beam of collimated radiation, (b) second means for supporting a substrate containing electrical circuit elements a distance from said first means,
(c) third means for effecting multi-axis relative movement between said first and second means to permit the radiant energy beam generated by said first means to scan the exposed surface of said electrical circuit containing substrate supported by said second means,
(d) fourth means for controlling said third means to effect controlled relative movement between said substrate and said radiant energy beam generated by said first means,
(e) said first means being operable to generate a sufficient intensity of said radiant energy beam to erode electrical circuit forming material from the surface stratum of said substrate, and
(f) master control means including an electronic computer operatively connected for predeterminately controlling the operation of said first means to cause it to generate and direct its radiations beam at the surface of said substrate and to simultaneously control (i) said fourth means in a manner to effect predetermined relative movement of said second means supporting said electrical circuit containing substrate and (ii) the beam generated by said first means to cause said beam to intersect a select portion of said substrate and controllably erode selected material from said substrate.

18. An apparatus in accordance with claim 17, wherein
said substrate contains at least one electrical circuit element integrally secured to a surface stratum of said substrate.
said master control means being operable to effect synchronized operation of said first means and said third means to effect the controlled erosion of a select portion of said electrical circuit element integrally secured to said substrate.

19. An apparatus in accordance with claim 17, including
means for guiding and driving said second means to cause said substrate supporting means to move with respect to a beam generated by said first means under the control of said electronic computer.

20. An apparatus in accordance with claim 17, including
means for deflection controlling said narrow beam of radiation,
said deflection control means being controlled in its operation by said electronic computer.

21. An apparatus in accordance with claim 17, including
means for selectively depositing electrical circuit fabricating material onto selected portions of said substrate,
said selective material depositing means being operatively controlled by said master control means to permit said electronic computer to control the fabrication of an electrical circuit on said substrate by effecting the selected erosion of material therefrom and the controlled deposition of selected amounts of said electrical circuit fabricating material in a controlled operational cycle.

22. An apparatus for selectively heating and processing a selected amount of material of the surface stratum of a substrate, said apparatus comprising:

(a) first means for generating radiant energy and means for forming a beam of said radiant energy,
(b) second means for supporting a workpiece a distance away from said first means,
(c) third means for operating said radiant energy generating means to cause it to generate said beam as a collimated beam of radiant energy of sufficient intensity to heat the material of said workpiece,
(d) fourth means for directionally controlling said collimated radiant energy beam to cause it to intersect and heat a selet portion of said workpiece, and
(e) fifth means for effecting controlled relative movement between said beam and said second means in a manner to cause said beam to selectively scan across a predetermined area of said workpiece at a controlled scanning rate to cause said beam to predeterminately heat a select portion of the material of the surface stratum of said workpiece.

23. An apparatus in accordance with claim 22, wherein
said first and fifth means are operable to cause said beam to selectively heat and melt a select portion of the surface stratum of said workpiece.

24. An apparatus in accordance with claim 22, including
a master control means operable for controlling the operation of said first and fifth means to gate the beam directed by said fourth means on and off in synchronization with the controlled relative movement between said beam and said workpiece supported by said first means
whereby said beam may be employed to heat select space-separated portions of the material of the surface stratum of workpiece supported by said second means.

25. An apparatus in accordance with claim 24, wherein
said fifth means for effecting controlled relative movement between said beam and said second means comprises means for controllably driving said means supporting said workpiece in at least one direction so as to carry work supported thereby in controlled movement in a predetermined path through the scanning field of said beam.

26. An apparatus in accordance with claim 24, wherein
said fifth means for effecting controlled relative movement between said beam and said second means comprises (i) means for deflecting said beam and (ii) means connected to said master control means for controlling said beam deflecting means to cause the scanning axis of said beam to intersect and to scan in a selected path across the surface of said workpiece and to cause said beam to predeterminately heat select portions of the material of the surface stratum of said workpiece.

27. An apparatus in accordance with claim 26, wherein
said first means is operable to generate said beam at sufficient intensity to melt material of the surface of said workpiece as said beam scans said surface.

28. An apparatus in accordance with claim 24, wherein
said first means is operable to generate said beam at sufficient intensity to vaporize material from the surface stratum of said workpiece intersected by said beam to permit the surfaces of workpieces intersected by said beam to be predeterminately surface shaped or contoured.

29. A method for selectively eroding material from a substrate to predeterminately fabricate said substrate, said method comprising:
(a) predeterminately relatively positioning a beam generating means and a substrate a distance apart with respect to each other with a select portion of the surface of said substrate facing said beam generating means to permit the beam generated by said beam generating means to intersect said select portion of the surface of said substrate,
(b) generating a narrow beam of collimated radiation by energizing said beam generating means at an intensity which is sufficient to permit the beam generated thereby to erode material from the portion of the surface stratum of said substrate intersected by said beam,
(c) effecting controlled relative scanning movement between said beam and said substrate while controlling the operation of said beam to cause said beam to selectively scan a select portion of the surface of said substrate and to selectively erode and remove material from said select portion of the surface stratum of said substrate, and
(d) as said beam scans and erodes material from said substrate, removing the eroded material from the vicinity of the surface of said substrate.

30. A method in accordance with claim 29, wherein said substrate defines an electrical circuit integrally secured to a support, said electrical circuit including said select portion of the surface stratum to perform at least one step in the fabrication of said electrical circuit when said select portion is eroded.

31. A method in accordance with claim 29, wherein the erosion of material from said surface stratum of said substrate is operable to surface finish at least a portion of said subtrate by providing a predetermined surface structure therof.

32. A method in accordance with claim 29, wherein said substrate defines a support for an electrical circuit,
said eroding step forms a cavity in said support, and
said method includes depositing electrical circuit forming material within said cavity.

33. A method in accordance with claim 29, wherein said beam is operable to volatize material from said substrate to effect the erosion of material from the surface stratum of said substrate.

34. A method in accordance with claim 29, wherein the material eroded from the surface of said substrate by said beam of radiation is removed from the vicinity of the area from which it is eroded by a fluid stream directed parallel to said radiation beam in the vicinity of said substrate.

35. A method in accordance with claim 29, which includes
directing a stream of oxidizing gas against the portion of the surface of said substrate intersected by said beam of radiation to cooperate with the radiant energy of said radiation beam in eroding material from said substrate by melting and vaporizing said material.

36. A method in accordance with claim 35, which includes
generating and directing a stream of particles at a high velocity against the area of said substrate intersected by said beam to erode material from said substrate which has been heated by said beam.

37. A method in accordance with claim 29, which includes
controllably moving said substrate while said beam generating means is energized and directs said beam against said substrate to cause said beam to predeterminately scan and erode a select portion of said substrate from said substrate.

38. A method in accordance with claim 29, which includes
feeding a fuel to the vicinity of said substrate and the area thereof intersected by said beam and burning said fuel immediately above the area of the substrate intersected by said beam to melt and volatize material of said substrate.

39. A method in accordance with claim 29, wherein said substrate includes surface defects such as surface cracks, cavities and other irregularities which are corrected and finished by melting and solidifying or vaporizing material of the surface stratum of said substrate whch the energy of said beam.

* * * * *

UNITED STATES PATENT AND TRADEMARK OFFICE
CERTIFICATE OF CORRECTION

PATENT NO. : B1 4,831,230
DATED : October 29, 1996
INVENTOR(S) : Jerome H. Lemelson It is certified that error appears in the above-indentified patent and that said Letters Patent is hereby corrected as shown below:

On the title page, item [73], delete the following:
Assignee: Bankers Trust Company, New York, N.Y.

Signed and Sealed this

Twenty-ninth Day of April, 1997

Attest:

BRUCE LEHMAN

Attesting Officer

Commissioner of Patents and Trademarks

REEXAMINATION CERTIFICATE (3034th)

United States Patent [19]

Lemelson

[11] B1 4,831,230

[45] Certificate Issued Oct. 29, 1996

[54] SURFACE SHAPING AND FINISHING APPARATUS AND METHOD

[75] Inventor: Jerome H. Lemelson, Metuchen, N.J.

[73] Assignee: Bankers Trust Company, New York, N.Y.

Reexamination Request:
No. 90/003,065, May 24, 1993

Reexamination Certificate for:
| | |
|---|---|
| Patent No.: | 4,831,230 |
| Issued: | May 16, 1989 |
| Appl. No.: | 936,484 |
| Filed: | Nov. 26, 1986 |

Related U.S. Application Data

[63] Continuation of Ser. No. 647,897, Sep. 6, 1984, abandoned, which is a continuation of Ser. No. 571,188, Apr. 24, 1975, abandoned, which is a continuation of Ser. No. 163,203, Jul. 16, 1971, abandoned, which is a continuation of Ser. No. 849,013, Aug. 11, 1969, abandoned, which is a continuation-in-part of Ser. No. 422,875, Nov. 25, 1964, Pat. No. 3,461,347, and a continuation-in-part of Ser. No. 710,517, Mar. 5, 1968, and a continuation-in-part of Ser. No. 501,395, Oct. 22, 1965, Pat. No. 3,371,404, and a continuation-in-part of Ser. No. 421,897, Dec. 29, 1964, Pat. No. 3,504,063.

[51] Int. Cl.$^6$ ............................ B23K 15/00; H01J 37/06
[52] U.S. Cl. ............................ 219/121.12; 219/121.14; 219/121.19; 219/121.2; 219/121.31
[58] Field of Search ............................ 219/121.12–121.35, 219/121.6, 121.67, 121.68, 121.69, 121.72, 69.1, 69.17, 121.8; 437/173; 313/339, 348, 455

[56] References Cited

U.S. PATENT DOCUMENTS

| | | | |
|---|---|---|---|
| 2,423,729 | 7/1947 | Rühle | 219/121.35 |
| 2,527,747 | 10/1950 | Lewis et al. | 118/723 EB |
| 2,746,420 | 5/1956 | Steigerwald | 219/121.15 |
| 2,771,568 | 11/1956 | Steigerwald | 315/382 |

(List continued on next page.)

FOREIGN PATENT DOCUMENTS

| | | |
|---|---|---|
| 246797 | 4/1962 | Australia . |
| 923134 | 4/1963 | United Kingdom . |

OTHER PUBLICATIONS

*Introduction to Electron Beam Technology,* pp. 354–381, Chapter 12 by Wells, edited by Bakish, Dec. 1962.

*"Electrical Engineering Theory and Practice,"* by Erickson et al., pp. 3–4, published Jul. 1959.

Steigerwald, "Electron Beam Milling," *Proceedings of the Third Symposium on Electron Beam Processes,* Mar. 23–24, 1961.

Miller and Garibotti, "Electron Beam Manufacturing Techniques for Integral Device Interconnections," paper asserted presented at Western Electronic Show and Convention (WESCON), Aug. 20–23, 1963.

Miller and Garibotti, "Versatile Interconnection–Packaging System for Integral Electronics Using Electron Beam Techniques," *Proceedings of the National Electronics Conference,* vol. XIX, Oct. 28–30, 1963.

Miller and Takenaka, "Electron Beam Welding," paper asserted published in *Welding Research Counsil Bulletin,* Oct. 1964.

(List continued on next page.)

*Primary Examiner*—Geoffrey S. Evans

[57] ABSTRACT

An apparatus and method for shaping and surface finishing articles and material of manufacture by means of intense radiation. In one form intense radiation, such as generated by an electron beam or beam of coherent light energy generated by a laser is controlled and caused to scan a portion of the surface of an article in such a manner as to selectively erode or vaporize material from the surface stratum of the article to shape or finish the surface thereof. In another form, the beam energy is employed to melt a portion of the surface stratum in a scanning operation wherein the melted material cools and solidifies into a layer having improved physical characteristics. In a modified form, such melted material is caused to flow and vary the shapte of the article.

B1 4,831,230
Page 2

U.S. PATENT DOCUMENTS

| Number | Date | Name | Class |
|---|---|---|---|
| 2,778,926 | 1/1957 | Schneider | 219/121.25 |
| 2,787,564 | 4/1957 | Shockley | 437/20 |
| 2,793,282 | 5/1957 | Steigerwald | 219/69.1 |
| 2,816,847 | 12/1957 | Shockley | 437/17 |
| 2,923,590 | 2/1960 | Lorenz | 347/227 |
| 2,932,588 | 4/1960 | Frank | 118/723 EB |
| 2,960,457 | 11/1960 | Kuhlman | 118/723 EB |
| 2,968,723 | 1/1961 | Steigerwald | 250/400 |
| 2,987,610 | 6/1961 | Steigerwald | 219/121.13 |
| 2,988,237 | 6/1961 | Devol, Jr. | 214/11 |
| 2,989,614 | 6/1961 | Steigerwald | 219/50 |
| 2,994,801 | 8/1961 | Hanks | 315/14 |
| 3,009,050 | 11/1961 | Steigerwald | 219/69.1 |
| 3,016,449 | 1/1962 | Steigerwald | 219/121.13 |
| 3,033,974 | 5/1962 | Schleich et al. | 219/117 |
| 3,056,881 | 10/1962 | Schwarz | 219/50 |
| 3,087,211 | 4/1963 | Howe | 164/506 |
| 3,112,850 | 12/1963 | Garibotti | 219/121.69 |
| 3,117,022 | 1/1964 | Bronson et al. | 427/526 |
| 3,118,050 | 1/1964 | Hetherington | 219/121.25 |
| 3,119,707 | 1/1964 | Christy | 117/37 |
| 3,134,010 | 5/1964 | Bettermann et al. | 219/69.1 |
| 3,139,552 | 6/1964 | Brewer | 313/455 |
| 3,140,379 | 7/1964 | Schleich et al. | 219/69.1 |
| 3,154,371 | 10/1964 | Johnson | 347/248 |
| 3,163,743 | 12/1964 | Wroth et al. | 219/137 R |
| 3,165,619 | 1/1965 | Cohen | 219/121.13 |
| 3,181,170 | 4/1965 | Akin | 219/121.8 |
| 3,192,318 | 6/1965 | Schleich et al. | 358/297 |
| 3,204,087 | 8/1965 | Millis, Jr. | 235/151 |
| 3,205,087 | 9/1965 | Allen | 219/121.15 |
| 3,206,336 | 9/1965 | Hora | 437/17 |
| 3,234,044 | 2/1966 | Andes et al. | 430/294 |
| 3,258,898 | 7/1966 | Garibotti | 219/121.12 |
| 3,259,730 | 7/1966 | Wehde et al. | 219/69.17 |
| 3,267,250 | 8/1966 | Ullery, Jr. | 219/121.29 |
| 3,276,902 | 10/1966 | Abraham | 427/596 |
| 3,291,959 | 12/1966 | Schleich et al. | 219/121.26 |
| 3,293,587 | 12/1966 | Robinson | 338/300 |
| 3,301,949 | 1/1967 | Ullery | 178/6.8 |
| 3,303,319 | 2/1967 | Steigerwald | 219/121.17 |
| 3,308,264 | 3/1967 | Ullery, Jr. | 219/121.32 |
| 3,326,176 | 6/1967 | Sibley | 118/697 |
| 3,330,696 | 7/1967 | Ullery, Jr. et al. | 430/296 |
| 3,340,601 | 9/1967 | Garibotti | 437/17 |
| 3,360,398 | 12/1967 | Garibotti | 219/121.12 |
| 3,364,087 | 1/1968 | Solomon et al. | 156/635 |
| 3,386,857 | 6/1968 | Steinmaier | 437/89 |
| 3,388,314 | 6/1968 | Gould | 250/493.1 |
| 3,388,461 | 6/1968 | Lins | 29/610.1 |
| 3,401,249 | 9/1968 | Schleich et al. | 219/69.1 |
| 3,402,278 | 9/1968 | Dembach | 219/69.1 |
| 3,404,254 | 10/1968 | Jones | 219/121.19 |
| 3,422,246 | 1/1969 | Wetzel | 219/121.67 |
| 3,426,174 | 2/1969 | Graham et al. | 219/121.12 |
| 3,448,280 | 6/1969 | Blitchington, Jr. et al. | 250/227.11 |
| 3,513,285 | 5/1970 | Imura | 219/121.13 |
| 3,535,488 | 10/1970 | Kitchin | 219/121.14 |
| 3,562,141 | 2/1971 | Morley | 219/121.15 |
| 3,569,660 | 3/1971 | Houldcroft | 219/121.68 |
| 3,699,334 | 10/1972 | Cohen et al. | 250/492.2 |
| 3,749,878 | 7/1973 | Sullivan et al. | 219/121.67 |

OTHER PUBLICATIONS

Schollhammer and Cyr, "Electron Beam Joining Techniques for Electronic Packaging," paper asserted published in the *Proceedings of the Fourth Symposium on Electron Beam Processes*, R. Bakish, ed., Mar. 29–30, 1962.

Crawford, "Electron Beam Machining," chapter 11 of Bakish, ed., *Introduction to Electron Beam Technology* (John Wiley & Sons, Inc.), asserted published in 1962.

DeGroat, *Metalworking Automation* (McGraw–Hill 1962).

Bakish, "Introduction to Electron Beam Technology," Chapter 13, pp. 382–400 (John Wiley & Sons 1962).

Miller & Garibotti, "Electron Beam Manufacturing Techniques for Integral Device Interconnections," *Western Electronic Show and Convention* (San Francisco, Aug. 1963).

Garibotti et al., "Automation of Electron–Beam Processes for Microelectronics," *First International Conference on Electron & Ion Beam Science & Technology*, pp. 293–336 (Bakish, ed. 1965) (asserted that Conference was on May 5, 1964).

Namba et al., "Automatic Control of Electron–Beam Micromachining," *First International Conference on Electron & Ion Beam Science & Technology*, pp. 264–282 (Bakish, ed. 1965) asserted that Conference was on May 5, 1964).

R. Bakish et al., *Handbook of Electron Beam Welding* (1964).

Namba et al., "Electron and Laser Beam Processing," *Japanese Journal of Applied Physics*, vol. 3, No. 9, pp. 536–545 (Sep. 1965).

Garibotti et al., "The Micro–Circuit Module—A Versatile Interconnection Packaging System," *Microelectronics and Reliability*, pp. 41–53, vol. 4 (1965).

van Ardenne et al., "A New Electron Beam Processing Plant for Thin Film Resistors with a Fundamental Equipment of the 80 kV–Type," pp. 841–856, *Metallurgical Society Conferences of Electron & Ion Beam Science & Technology*, vol. 2 (Bakish ed., Apr. 1966).

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4–7, 16, 21, 32, 34–36 and 38 is confirmed.

Claims 1, 2, 17–20, 22–31, 33 and 37 are cancelled.

Claims 3, 8, 9, 11, 13, 15 and 39 are determined to be patentable as amended.

Claims 10, 12 and 14, dependent on an amended claim, are determined to be patentable.

New claims 40 and 41 are added and determined to be patentable.

3. An apparatus in accordance with claim [2] *4*, wherein said third means comprises means for movably supporting said second means and motor means for reversably driving said supporting means for said substrate within said chamber,
said master control means being operable to control the operation of said motor means to predeterminately move said supporting means for said substrate while controlling the operation of said first means for generating radiant energy.

8. An apparatus in accordance with claim [1] *4*, wherein said first means is operable to generate radiant energy at sufficient intensity to melt material of said substrate.

9. An apparatus in accordance with claim [1] *4*, wherein said first means comprises an electron gun for generating and directing a beam of electrons at said substrate.

11. An apparatus in accordance with claim [1] *4*, wherein said first means comprises a laser for generating a beam of coherent light energy at said substrate.

13. An apparatus in accordance with claim [1] *4*, wherein said first means is operable to generate said radiant energy of sufficient intensity to cause said beam to selectively vaporize material from the surface stratum of said substrate.

15. An apparatus in accordance with claim [1] *4*, including means for programming said master control means to cause (i) said first means to variably generate said radiation beam and (ii) said third means to vary the relative movement between said beam and said substrate to cause said beam to scan and predeterminately erode material from a plurality of separate portions of said substrate.

39. A method in accordance with claim 29, wherein said substrate includes surface defects such as surface cracks, cavities and other irregularities which are corrected and finished by melting and solidifying or vaporizing material of the surface stratum of said substrate [which] *with* the energy of said beam.

*40. An apparatus in accordance with claim 4 further comprising an automatic manipulator operatively connected to said master control means and controlled thereby to permit articles which have been operated thereon in said chamber to be removed therefrom and replaced with unfinished articles.*

*41. An apparatus in accordance with claim 40 wherein the automatic manipulator is located outside the chamber.*

* * * * *